United States Patent [19]

Butler

[11] Patent Number: 4,573,851

[45] Date of Patent: Mar. 4, 1986

[54] SEMICONDUCTOR WAFER TRANSFER APPARATUS AND METHOD

[75] Inventor: Robert M. Butler, Tempe, Ariz.

[73] Assignee: Microglass, Inc., E. Syracruse, N.Y.

[21] Appl. No.: 495,642

[22] Filed: May 18, 1983

[51] Int. Cl.$^4$ .............................................. B65G 65/04
[52] U.S. Cl. .................................... 414/404; 414/417; 414/786; 211/41
[58] Field of Search ............... 414/404, 417, 786, 754, 414/287; 211/41, 126; 118/500, 728; 206/448, 454; 156/613; 432/258, 259; 269/296, 903; 198/649

[56] References Cited

U.S. PATENT DOCUMENTS

| | | | |
|---|---|---|---|
| 3,534,862 | 10/1970 | Shambelan | 211/41 |
| 3,606,034 | 9/1971 | Lewis | 414/417 |
| 3,949,891 | 4/1976 | Butler et al. | 211/41 X |
| 4,001,585 | 1/1977 | Coutarel | 414/417 X |
| 4,040,533 | 8/1977 | De Boer et al. | 414/417 |
| 4,311,427 | 1/1982 | Coad et al. | 414/417 X |

FOREIGN PATENT DOCUMENTS 5219673 2/1979 Japan ..................... 414/287

Primary Examiner—Joseph E. Valenza
Assistant Examiner—David A. Bucci
Attorney, Agent, or Firm—Cahill, Sutton & Thomas

[57] ABSTRACT

An apparatus for transferring wafers between carriers with different wafer spacings and different wafer capacities includes an elevator with two sets of wafer supporting grooves that extend through a carrier to lift wafers from it to a temporary holding region whereat the first and second groups of wafers can be selectively retained by means of first and second movable retainers and first and second retainer blocks. Each wafer supporting groove includes a steeply inclined surface that contacts one point of an edge of a wafer, urging a peripheral portion of the opposite face against a flat opposite vertical wall of the groove. The steeply inclined surface of another wafer supporting groove contacting the same wafer urges a peripheral portion of the opposite wafer face against a flat vertical wall of the second groove. The first and second retainers each contain V-grooves that are aligned with V-grooves of a corresponding one of the retainer blocks to support alternate wafers in the holding region. The retainers and retainer blocks are laterally shiftable to align the V-grooves of either the first retainer or the second retainer with the odd numbered wafer support grooves.

15 Claims, 19 Drawing Figures

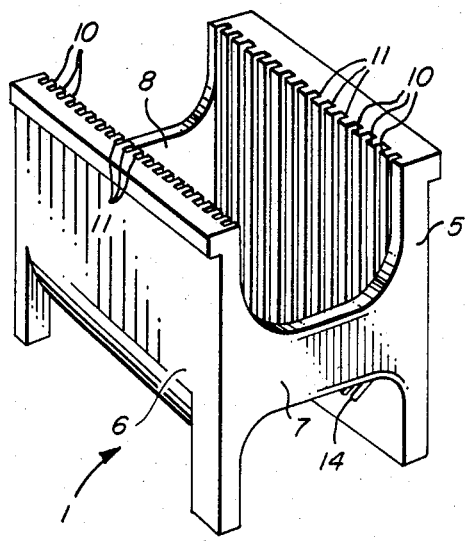
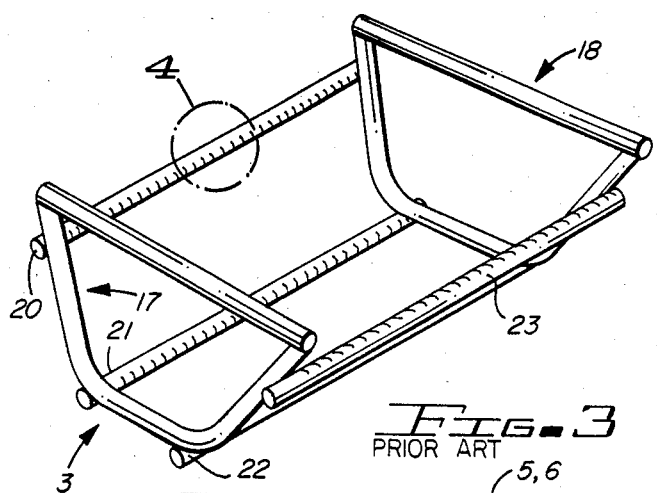
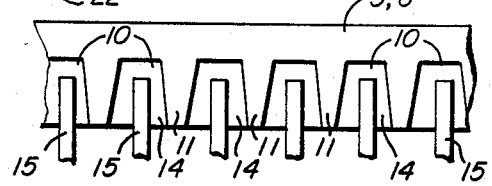
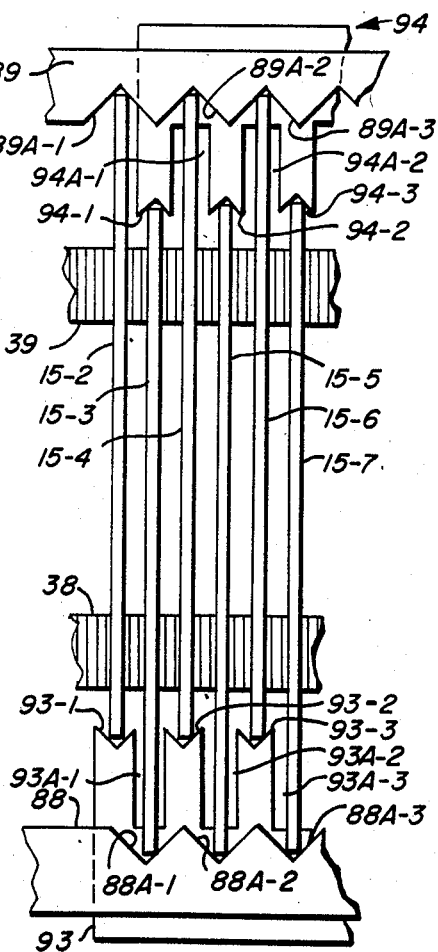

SEMICONDUCTOR WAFER TRANSFER APPARATUS AND METHOD

BACKGROUND OF THE INVENTION

The invention relates to apparatus and methods for transferring semiconductor wafers between various wafer carriers, such as fifty-wafer quartz diffusion boats and twenty-five wafer plastic carriers, wherein the spacings between wafers in the different carriers are different; the invention relates more particularly to wafer transferring apparatus and methods that minimize the production of "silicon dust" particles broken from the edges of the semiconductor wafers during wafer transferring operations.

It is well known that numerous cleaning, coating and diffusion operations are required in the fabrication of semiconductor wafers, and that often fifty-wafer quartz boats are used, wherein there is three/thirty-seconds (3/32) of an inch center-to-center spacing between the wafers for diffusion operations, whereas for most other cleaning operations, plastic twenty-five wafer carriers, such as one manufactured by Flower, Inc. of Jaska, Minn., have three sixteenths (3/16) of an inch center-to-center spacing between wafers. The plastic wafer carriers also have long vertical side grooves or wafers guides, the bottoxsof which are approximately one hundred mils wide and the sides of which are tapered outwardly by approximately two degrees. A number of prior devices and methods for transferring wafers from the quartz diffusion boats to plastic carriers are known. The most elementary method is manual transfer by using tweezers to grip the edges of the wafers. This results in an excessive amount of breakage of silicon wafers, and also results in breaking off of minute pieces of silicon semiconductor material. Another prior art device is the one described in my U.S. Pat. No. 3,949,891. Several other automatic wafer transfer systems have been marketed by the present assignee and by other competitive companies. All of the prior wafer transfer systems generate a higher quantity of "silicon dust" that is not desirable. The most efficient, highest yield semiconductor manufacturing facilities include expensive equipment and require extensive precautions on the part of workers to maintain the wafer fabrication environment at the highest possible level of purity. For example, expensive laminar air flow systems, and expensive dust filters often are used. The most modern facilities completely eliminate use of tweezers and manual handling of wafers in order to reduce the amount of silicon dust that is produced, and all workers wear clean gowns, hair nets, and in some cases, even face masks. However, due to build-up of static electricity on various wafer handling components, even small amounts of silicon dust can become attached to wafer surfaces or surfaces that touch wafers. For example, silicon dust can become attached to the sides of the grooves of the above-mentioned plastic wafer carriers, and when the wafers are transferred into such carrier, the peripheral portion of the active face of the wafer may slide against such silicon dust, causing defects in one or quite a few peripheral circuits on the wafer. This, of course, reduces yield and increases the overall cost per unit of the circuits being manufactured.

Another problem with previous automatic wafer transfer systems is that they have required too much floor space. Available room in a wafer fabrication facility is scarce, due to the very high cost per square foot of maintaining an ultra-pure environment. Previous wafer transfer devices have operated too slowly, some of them having a transfer cycle time of as long as twenty (20) minutes to transfer fifty wafers from one type of carrier to another.

Thus, there remains a need for a relatively high speed, low cost, wafer transfer system that greatly reduces the amount of physical contact with the wafers over previous wafer transfer systems in order to greatly reduce or eliminate the production of silicon dust.

Some of the previous wafer transfer systems not only produce quite a lot of silicon dust as the edges of the wafers contact various holding elements during the wafer transfer process, they produce dust at such a location that it falls directly onto a region in which other silicon wafers are presently positioned. Some of this dust inevitably comes into sliding contact with the surface of some of the wafers, causing yield-reducing defects therein.

Therefore, it is an object of the invention to provide an improved wafer transferring apparatus and method which greatly reduces or eliminates sliding contact between the active surface of a wafer, and furthermore eliminates production of any silicon dust at a location above any other semiconductor wafers.

It is another object of the invention to produce an improved wafer transfer system that eliminates production of silicon dust and can be implemented in a small amount of space.

SUMMARY OF THE INVENTION

Briefly described, and in accordance with one embodiment thereof, the invention provides a wafer transfer apparatus and method for transferring semiconductor wafers between a first carrier having a first number of wafer support slots therein and one or more second carriers having a second different number of slots avoiding sliding contact between any portion of a wafer and any portion of the apparatus and carriers. In the described embodiment of the invention the first carrier is a quartz diffusion boat containing fifty wafers and the second carrier is a plastic carrier having twenty-five wafer positions therein. To transfer the fifty wafers from the quartz boat into first and second twenty-five wafer plastic carriers, the quartz boat containing the fifty wafers is placed on a stand of the wafer transfer device. An elevator containing two elevators that can be extended upwardly through openings in the quartz boat as it rests on a stand has fifty pairs of spaced wafer supporting slots in first and second members of the elevator. The first wafer supporting slot of each pair has a steeply inclined surface on which a first edge of a particular wafer rests, forcing a small peripheral portion of a first face of that wafer against a vertical flat surface of the first slot. Each first wafer supporting elevator slot is aligned with a corresponding second wafer supporting elevator slot that has a steeply inclined surface against which a second edge of the same wafer rests, forcing a small peripheral portion of the opposite face of that same wafer against a vertical flat surface of the second elevator slot. The vertical flat surfaces of all of the wafer supporting slots are precisely parallel, so that all of the fifty wafers are held firmly and precisely parallel to each other and effectively resist any tilting as they are lifted by elevator from the quartz boat and into a wafer holding region. Thus, each wafer supported by the elevator has two small peripheral portions of opposed faces being urged against precisely vertical faces of the wafer supporting elevator slots supporting that wafer and therefore cannot tilt from vertical in either direction.

The temporary holding region is partially bounded by a first retainer block having twenty-five vertical V-grooves therein and a second retainer block which is parallel to the first wall and has twenty-five vertical V-shaped grooves therein. V-shaped grooves of the first set are offset from the V-shaped grooves of the second set. Initially, the V-shaped grooves of the first retainer block are aligned with odd numbered pairs of wafer supporting elevator slots and the V-shaped grooves of the second retainer block are aligned with the even numbered pairs of wafer supporting elevator slots.

A first retainer is moved from a retracted position to a position partially beneath the edge portions of the fifty wafers opposite to the second retainer block. The first retainer has twenty-five spaced V-shaped grooves and twenty-five deep slots disposed between those V-shaped grooves. These twenty-five V-shaped grooves are aligned with the V-shaped grooves of the second retainer block.

A second retainer also is moved from a retracted position opposite to the first retainer block to a position partially beneath the fifty wafers. The second retainer also has twenty-five spaced V-shaped grooves and twenty-five deep slots therebetween. These V-shaped grooves are aligned with the V-shaped grooves of the first retainer block.

The elevator is lowered in the next step of the wafer transfer process. The edges of the "odd numbered" wafers pass through the respective deep slots of the second retainer and come to rest in the V-shaped grooves of the first retainer, causing the odd numbered wafers to roll toward and have their edges rest in the respective V-shaped grooves of the second retainer block. The odd numbered wafers then are being supported in the temporary holding region. Similarly, the edges of the "even numbered" wafers pass into the deep slots of the first retainer plate and come to rest on the V-shaped grooves of the second retainer, causing the edges of the even numbered wafers to roll toward and rest in the respective V-shaped grooves of the second retainer block. Thus, all fifty of the wafers are supported in the wafer holding region. The elevator then is lowered further. The quartz boat is removed from the stand. The first plastic carrier then is positioned on the stand. The elevator is automatically raised through the first plastic carrier until its fifty wafer supporting elevator slots engage and lift the fifty wafers in the wafer holding region up from the various retainer V-shaped grooves and retainer plate V-shaped grooves. The first retainer then is withdrawn from the wafer holding region.

The elevator then is lowered. The even numbered wafers again rest in the second retainer's V-shaped grooves and the second retainer block's V-shaped grooves and remain supported in the wafer holding region. The odd numbered wafers pass through the deep slots in the second retainer and are lowered into the wafer grooves of the first plastic carrier. The elevator grooves hold the odd numbered wafers sufficiently precisely vertical that none of the edge face portions of the wafers touch or slide against the sides of the wafer grooves of the first carrier as those wafers are being lowered. After the elevator is fully retracted, the first carrier and the odd numbered wafers therein are removed from the stand.

Sensing of this removal causes a head mechanism including the first and second retainers and the first and second retainer blocks and the twenty-five even numbered wafers supported thereby all to laterally shift through a distance equal to the center-to-center spacing between adjacent wafer-supporting elevator slots, so that the even numbered wafers are now aligned with the odd numbered wafer supporting elevator slots. A second plastic carrier is placed on the stand. The elevator then automatically rises until the odd numbered wafer supporting elevator slots slightly lift the twenty-five even numbered wafers that remain in the wafer holding region. The second retainer then is withdrawn. The elevator is lowered, thereby lowering the even numbered wafers into the wafer guide slots of the second plastic carrier. When the even numbered wafers have come to rest in the second carrier, it is removed from the stand. Thus, the transfer of the fifty wafers from the quartz boat into the two twenty-five wafer plastic carriers has been accomplished. In the discovered embodiment of the invention, the process takes only approximately two minutes. Physical contact between the wafers and various surfaces of the transfer machine and the plastic carriers has been minimized. The procedure for transferring twenty-five wafers from the first plastic carrier to odd numbered slots of the quartz boat and for transferring twenty-five wafers from the second plastic carrier to even numbered slots of the quartz boat is essentially the reverse of the above-described process. Similarly, transfer of wafers from one twenty-five wafer carrier to a different type of twenty-five wafer carrier can be accomplished, as long as the spacings of the wafer support grooves or slots of the two carries are compatible

BRIEF DESCRIPTION OF THE DRAWINGS

FIG. 1 is a partial perspective view of a plastic 25-wafer carrier which is used in conjunction with the wafer transfer apparatus and method of the invention.

FIG. 2 is a sectional view illustrating the wafer guide grooves in the wafer carrier of FIG. 1.

FIG. 3 is a perspective view of a quartz 50-wafer diffusion boat used in conjunction with the wafer transfer apparatus and method of the invention.

FIG. 4 is an enlarged view of detail 4 of FIG. 3.

FIG. 5 is a diagram of a top view of the wafer holding region of the transfer apparatus.

FIG. 6 is a diagram of detail 6 of FIG. 5 enlarged and modified to illustrate holding of wafers in a shiftable head mechanism in FIG. 5.

DESCRIPTION OF THE INVENTION

Figure 7:
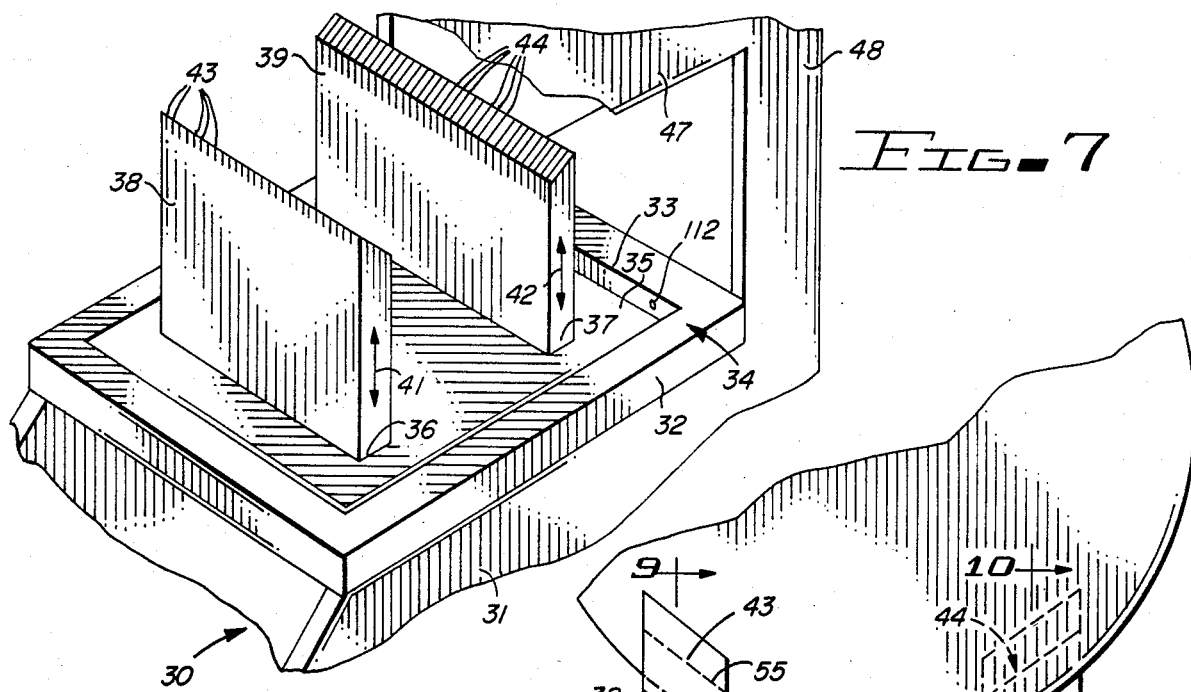
FIG. 7 is a partial perspective view illustrating a stand on which the carriers of FIGS. 1 and 3 can be placed and a wafer elevator mechanism.

Before describing the structure of the wafer transfer apparatus of the present invention, it will first be helpful to describe in structure the details of the above-mentioned plastic carrier and the above-mentioned quartz diffusion boat between which the wafers are to be transferred.

Referring now to FIG. 1, a typical plastic wafer carrier 1 is shown. In order to understand the operation and advantages of the wafer transfer apparatus and method of the present invention, it is necessary to understand in detail the structure of plastic carrier 1, and also the structure of quartz diffusion boat 3 of FIG. 3, since it is these two carriers between which the wafer transfer apparatus of the present invention effects exchange silicon semiconductor wafers. The silicon wafers are typically roughly 10 to 30 mils in thickness, and typically have diameters of 5 or 6 inches. Referring now to FIGS. 1 and 2, plastic carrier 1 includes an open frame having first and second vertical sides 5 and 6 connected by two end sections 7 and 8. Side 5 has 25 interior grooves 10, each separated by a ridge 11. The sides of each vertical groove 10 are tapered slightly, roughly 2°. The width of each groove is approximately ⅛ inch. At the bottom of each vertical groove 10 is a steeply sloped bottom surface 14.

The sloped surfaces 14 engage the edges of wafers 15 to support them and prevent them from falling through the open interior of plastic carrier 1. Twenty-five grooves 10 also are formed in the interior wall of sides 6 of plastic carrier 1. Each of these twenty-five grooves 10 in wall 6 is exactly opposite to a corresponding groove 10 on the interior wall of side 5.

Referring now to FIGS. 3 and 4, a typical 50-wafer quartz diffusion "boat" 3 is shown. Quartz boat 3 includes two parallel end pieces 17 and 18 which are connected together by four quartz rails 20, 21, 22, and 23, the ends of which are welded to side and bottom portions of end pieces 17 and 18. End pieces 17 and 18 also are composed of quartz rod material. As illustrated in FIG. 4, which is an enlargement of detail 4 of FIG. 3, each of the quartz rails 20, 21, 22 and 23 has 50 grooves therein. Each of the 50 grooves of each rail is precisely aligned with a corresponding groove that has been sawed in each of the other 3 rails, so that each circular wafer rests quite precisely in those 4 aligned grooves.

The center-to-center spacing between each of the grooves 10 in plastic carrier 1 is 3/16 of an inch. The center-to-center spacings of the grooves 26 of quartz boat 3 are 3/32 of an inch. The length of plastic carrier 1 is approximately equal to the length of quartz boat 3.

With the foregoing information in mind, part of the structure of wafer transfer system 30 of the present invention is shown in FIG. 7. Wafer transfer system 30 includes a base 31 which rests on a table top (not shown). A "stand" 34 for supporting either quartz boat 3 or plastic carrier 1 includes a rectangular frame 32. Frame 32 has a vertical interior wall 33 that surrounds a floor surface 35 having two elongated rectangular apertures 36 and 37 therein. The inner dimensions and features of frame 32 are selected to precisely accommodate the base of wafer carrier 1 and also the bottom rails 21 and 22 of diffusion boat 3.

Two wafer elevator members 38 and 39 can be extended upward out of and receded into rectangular opening 36 and 37, respectively. The two elevator members 38 and 39 move simultaneously upward and downward in synchronization in the directions indicated by arrows 41 and 42, respectively. Each of elevator members 38 and 39 (hereinafter simply elevators 38 and 39) has 50 wafer-supporting elevator grooves therein. More specifically, reference numeral 43 designates the wafer-supporting grooves in elevator member 38 and reference numeral 44 designates the 50 wafer supporting grooves in elevator 39. The structure of the foregoing wafer-supporting grooves constitutes an important aspect of the present invention, and the structure of these grooves will be described in detail with reference to FIGS. 8, 9 and 10.

Figure 8:
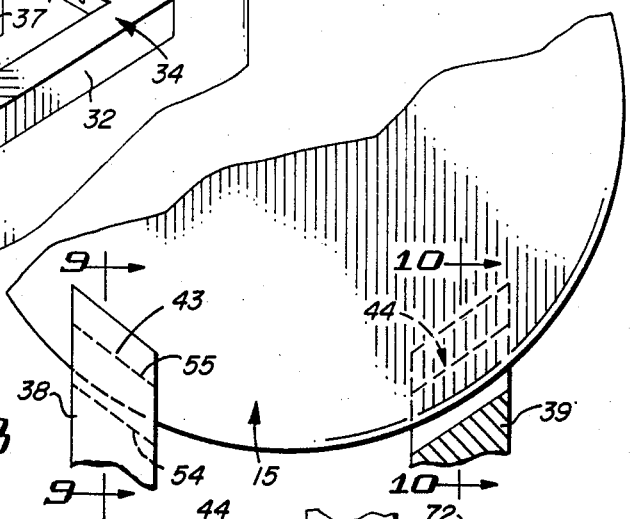
FIG. 8 is a partial elevational view illustrating the elevator elements of FIG. 7 holding a semiconductor wafer.

Referring to FIG. 8, it can be seen how a particular semiconductor wafer 15 is supported by a particular wafer-support groove 43 of elevator 38 and a corresponding, directly opposed wafer-supporting groove 44 in elevator member 39. In FIG. 8, it can be seen that wafer 15 is held vertically by the two wafer-supporting grooves 43 and 44. In accordance with the present invention, the structure of the wafer-supporting grooves is such that all of the wafers 15 are held very precisely vertical and parallel. It will be appreciated that this is an advantage when it is realized that the two elevators 38 and 39 are initially receded into floor openings 36 and 37 before a plastic carrier such as 1 in FIG. 1 with 25 wafers such as 15 therein is precisely positioned on floor 35 (FIG. 7) of wafer transfer stem 30. Features of frame 32 in floor 32 (not shown) assure precise and proper positioning of the support legs of plastic carrier 1 on floor 35 so that alternate wafer-supporting grooves 43 and 44 are precisely aligned with the 25 wafers being supported in grooves 10 of plastic carrier 1. During the wafer transfer operation the elevators 38 and 39 slowly are raised upward into the interior of plastic carrier 1 so that the alternate wafer-supporting grooves 43 and 44 engage the lower edge portions of the respective wafers and lift them upward into a wafer holding region 46 surrounded by a frame 47, which is supported above stand 34 by two vertical side members 48.

As previously explained, silicon dust that may be present in a wafer processing environment may adhere to the surface of the wafer or to the sides of the wafer grooves 10 in plastic carrier 1. It is highly desirable that as the wafers 15 are raised out of plastic carrier 1 there be no sliding of the peripheral edges of the wafers against the walls of grooves 10, since such sliding would cause any adherent silicon dust to scratch the wafer surface and thereby produce defects in the integrated circuits being formed thereon.

Figure 9:
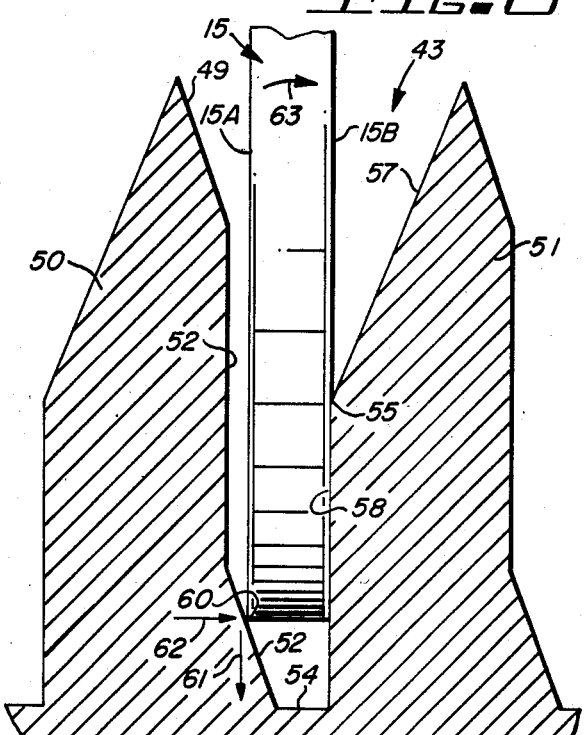
FIG. 9 is a partial section diagram taken along section lines 9—9 of FIG. 8, illustrating a wafer supporting groove of one of the elevator elements of FIG. 8 holding a semiconductor wafer.

Referring now to FIG. 9, it is seen that a particular one of wafer-supporting grooves 43 includes a side 50 and a side 51. Wafer 15 has a face 15A and an opposite face 15B. Side 50 of wafer-supporting groove 43 includes an inclihed face 49, a vertical face 51, and a lower inclined surface 52 that extends from a line 55 (FIG. 8) to a bottom 54 of groove 43. Side 51 of wafer-supporting groove 43 has an upper inclined wall 57 that extends downward to a vertical wall 58. Vertical wall 58 is perfectly flat and is the only portion of wafer-supporting groove 43 that directly contacts the peripheral portion of major surface 15B of wafer 15. In the present embodiment of the invention, the height of the portion of vertical wall 58 is only approximately 0.1 inch. The slope of inclined surface 52 is approximately 20 degrees from vertical.

It can be seen that the width of wafer 15, which is narrower than the distance between walls 51 and 58 but wider than the width of bottom 54, causes wafer 15 to have its outer edge 60 rest on steeply inclined surface 52 of groove 43. Arrow 61 represents the downward force of the weight of wafer 15 on surface 52. Due to the steep inclination of surface 52, wafer 15 tends to slide to the right in groove 43, producing a horizontal force component designated by reference numeral 62 in FIG. 9 This horizontal force component maintains wafer surface 15B tightly against vertical surface 58 of groove 43. It can be readily seen in FIG. 9 that any tendency of wafer 15 to rock in the direction of arrow 63 will be strongly resisted by vertical surface 58, since a great deal of force would be required to force the upper portion of wafer 15 to the right enough to cause its lower edge to overcome the frictional forces on inclined surface 52 and vertical surface 58 and slide upward along inclined surface 52.

Figure 10:
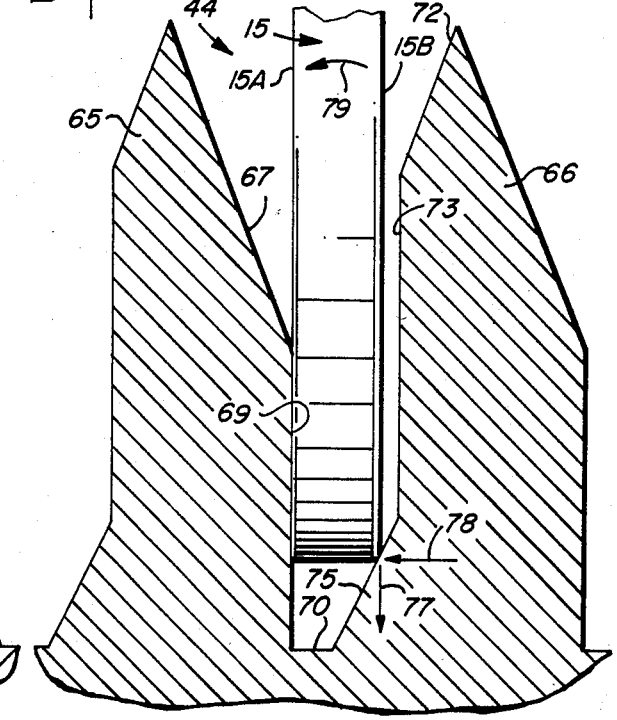
FIG. 10 is a partial section view taken along section line 10—10 of FIG. 8, illustrating the wafer supporting groove of the opposite elevator element of FIG. 8 holding the same wafer as the groove of FIG. 9.

Referring now to FIG. 10, the structure of the directly opposed wafer-supporting groove 44 in which another portion of the same wafer 15 is supported is described in detail. Groove 44 has a side 65 and a side 66. Side 65 has a steeply clined surface 67 and a precisely vertical lower surface 69, analogous to surface 58 of FIG. 9, that extends from the junction with surface 67 to the bottom 70 of groove 44. Side 66 of groove 44 has an upper inclined surface 72 which extends down to a vertical surface 73. Vertical surface 73 extends down to a lower steeply inclined surface 75, which is analogous to surface 52 of FIG. 9, and which extends to the bottom of groove 70. In the manner previously described with reference to groove 43, the weight of wafer 15 produces a downward force component 77 on inclined surface 75, causing surface 15A of wafer 15 to be pressed tightly precisely against vertical side 69 of groove 44. The resulting horizontal force component is designated by reference numeral 78 in FIG. 11.

It can be readily seen that the abutment of face 15A of wafer against vertical surface 69 of groove 44 strongly resists any forces tending to rock wafer 15 in the direction indicated by arrow 79 in FIG. 10.

It can be seen that the two directly opposed wafer-supporting grooves 43 and 44 precisely hold wafer 15 in a vertical position and strongly resist any forces tending to tilt the wafer toward either side of either groove, since one precision flat surface 58 abuts one face 15B of wafer 15 and another precision flat surface 69 precisely abuts the opposite face 15A of that same wafer.

Thus, it is seen that the portion of wafer transfer system 30 described up to now has the capability of precisely lifting 25 wafers out of a plastic carrier such as 1 (FIG. 1) properly positioned on stand 34 and also has the capability of lifting 50 wafers out of a quartz boat such as 3 (FIG. 3) that is properly positioned on stand 34.

Since the grooves 10 of plastic carrier 1 are considerably wider than the wafers usually held therein, the alternate wafer-supporting grooves on elevators 38 and 39 have wider upper dimensions (not shown) than the even numbered wafer-supporting grooves to ensure that wafers lifted from plastic carrier 1 do not accidentally get positioned in even numbered wafer-supporting grooves. This technique works well because the 50 grooves in each rail of quartz boat 3 are narrower (typically 32 mils) and are more precisely positioned than the grooves 10 of plastic boat 1.

Now referring to FIG. 5, the structure of the mechanism associated with wafer holding region 46 supported by frame 47 (also see FIG. 7) will be described. A horizontally shiftable head mechanism 82 is supported within rectangular frame 47, and can be laterally shifted in the direction indicated by arrows 83 by a distance equal to 3/32 of an inch, which is the center-to-center spacing between the grooves in quartz boat 3. The support and lateral shifting of head 82 is accomplished by means of a pneumatic cylinder mechanism 85 and a mechanical coupling 86, details of which are omitted, but can be readily implemented by those skilled in the art.

Head mechanism 82 includes a first retainer block 88, a second retainer block 89, and two end plates 90 and 91 forming a rectangular frame that encloses wafer-holding region 46. The view shown in FIG. 5 is a top view looking down into wafer transfer system 30 from above wafer holding region 46. It can be seen that elevators 38 and 39 previously described can be raised up into wafer holding region 46. The height of first and second retainer blocks 88 and 89 is approximately two inches. First retainer block 88 has 25 vertical V-shaped grooves 88A, each of which is approximately two inches long.

The retainer block grooves 88A have center-to-center spacings of 3/16 of an inch. Similarly, second retainer block 89 has 25 vertical V-shaped grooves 89A, each of which is also approximately two inches in length. First retainer block 88 and second retainer block 89 are disposed at the same elevation in head mechanism 82. The first retainer block grooves 88A are laterally offset by 3/32 of an inch relative to second retainer block grooves 89A.

Head mechanism 82 also includes a first retainer 93 and a second retainer 94. First retainer 93 is disposed beneath first retainer block 88, and is movable independently of retainer block 88 in the directions designated by arrow 95, but is in fixed relationship to first retainer block 88 with respect to movement in the direction indicated by arrows 83. Similarly, second retainer 94 is independently movable in the directions designated by arrows 96, but does not move in the direction of arrows 83 except when the entire wafer-holding head 82 moves in those directions.

The relative vertical positions of retainer block 88 and 89, retainers 93 and 94, stand 34, and elevators 38 and 39 be seen from the diagrams in FIGS. 11A and 11B, which are subsequently referred to in describing the operation of wafer transfer system 30.

The independent movement of first retainer 93 in the direction of arrows 95 is effectuated by means of a pneumatic mechanism 98 and a mechanical coupling 99 of pneumatic mechanism 98 to first retainer 93. The details of this implementation, including the pneumatic cylinders and the way guides in which first retainer 93 slides can be readily implemented by those skilled in the art and are therefore omitted. Similarly, pneumatic mechanism 100 and mechanical coupling 101 effectuate movement of second retainer 98 in the direction of arrows 96.

First retainer 93 has 25 sloped V-shaped grooves 93-1, 93-2, 93-3, etc. Between each pair of V-shaped grooves 93-1, 93-2, etc. is a relatively deep slot 93A01, 93A02, 93A03, etc. which allow raising and lowering of alternate wafers that are not supported by V-shaped grooves 93-1, 93-2, etc.

Similarly, second retainer 94 has 25 sloped V-shaped groove 94-1, 94-2, 94-3, etc. and slots 94A-1, 94A-2, etc. disposed respectively therebetween.

Each of the 25 V-shaped grooves 93-1 is aligned with a corresponding one of the V-shaped grooves 89A of rear retainer block 89. Thus, with first retainer 93 and second retainer 94 both extended into wafer holding region 46, V-shaped grooves 91-1 and 89A-1 can support a silicon wafer 15-2. V-shaped grooves 94-1 and 88A-1 can support a wafer 15-3, slot 93A-1 accommodating the forward portion of that wafer. Grooves 93-2 and 89A-2 can support a wafer 15-4, slot 94A-1 accommodating the rear portion of that wafer. Wafer 15-5 is supported by grooves 94-2 and 88A-2, wafer 15-6 is supported by grooves 93-3 and 89A-3, and wafer 15-7 is supported by grooves 94-3 and 88A-3.

As will become clear subsequently, FIG. 6, which is an enlarged view of detail 6 of FIG. 5 is in the nature of a sectional view at the point in which the V-shaped grooves of the retainers 93 and 94 contact the edges of the various wafers. FIG. 11G best illustrates a side view that shows how retainers 93 and 94 and retainer blocks 88 and 89 support wafers in the wafer holding regions.

With the foregoing description of the structure in mind, FIGS. 11A–G and FIGS. 12A and 12B will be referred to to explain how 25 wafers that are initially loaded in a first plastic carrier 1 and 25 additional wafers that are initially loaded in a second identical plastic carrier are transferred from those two plastic carriers into wafer holding region 46. Subsequently, after the second plastic carrier has been removed from stand 34 and replaced by quartz boat 3, the 50 wafers in holding region 46 are lowered into the 50 respective sets of slots in diffusion boat 3, completing that particular wafer transfer operation.

Figure 11A:
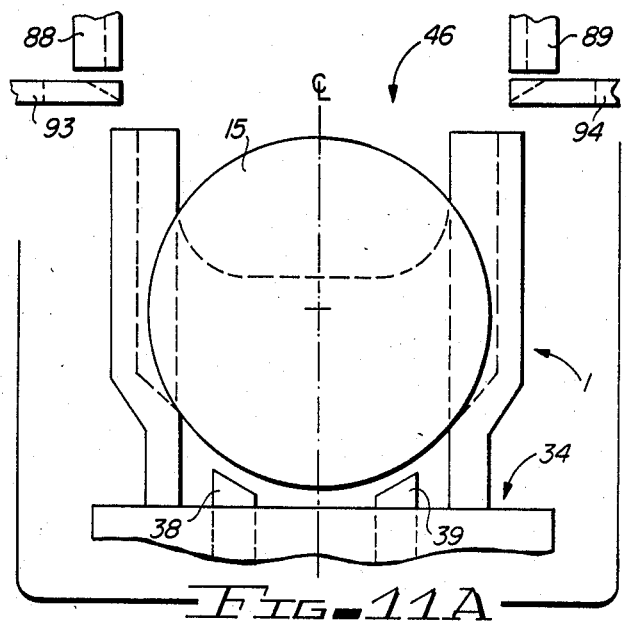
FIGS. 11A–11G are diagrams useful in explaining several sequences of operation of the wafer transfer device of the present invention.
Figure 11D:
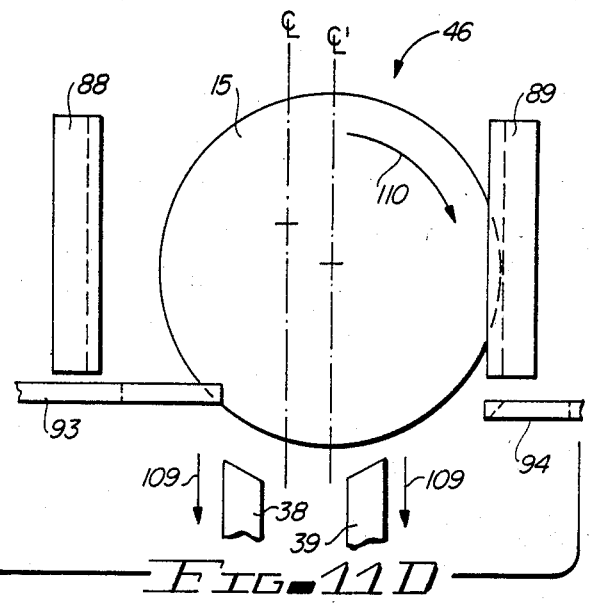
Figure 11B:
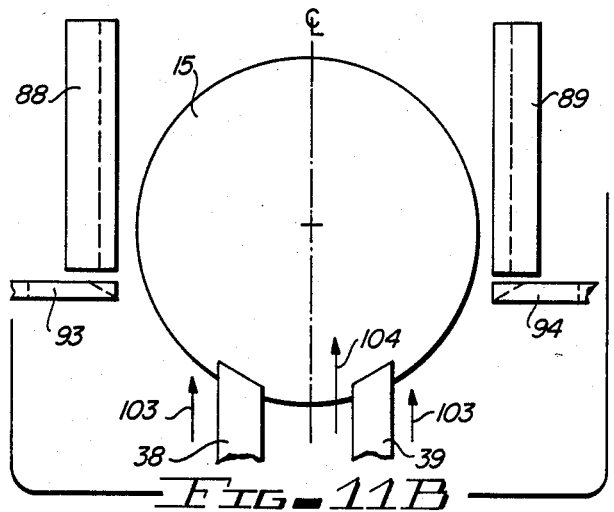
Figure 11E:
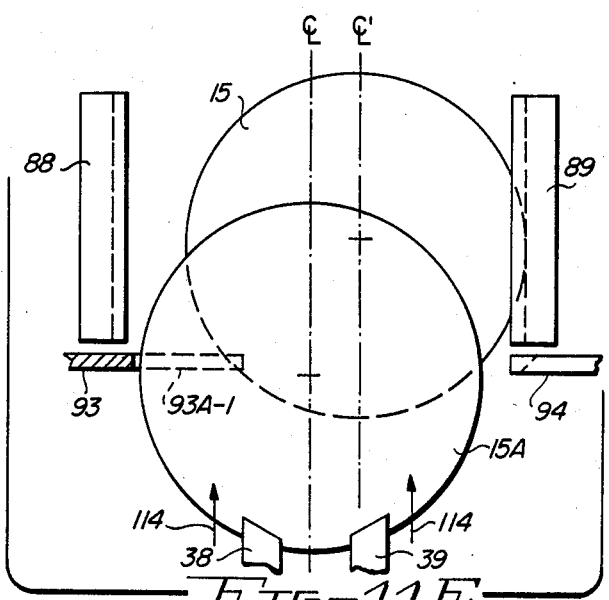

The first step in the foregoing process is to place the first plastic carrier 1 and 25 wafers therein on stand 34, as shown in FIG. 11A. At this point, elevators 38 and 39 are below the wafers 15 supported in first plastic carrier 1. Note that both first retainer 93 and second retainer 94 initially are receded from wafer holding region 46. Referring to FIG. 11B, the next step is to slowly raise elevators 38 and 39 in the direction indicated by arrows 103. The "odd numbered" wafer supporting grooves 43 and 44 of elevators 38 and 39, respectively, have widened upper portions, as previously explained, and the sloped edges (such as 50 and 57 in FIG. 9) guide the wafers 15 in plastic carrier 1 into the lower portions of the odd numbered wafer supporting grooves. At this point in the operation, the 25 wafers become positioned precisely vertically and move upward in the direction of arrow 104 (FIG. 11B) without touching any of the ridges 11 (FIG. 1) in plastic carrier 1.

Figure 11C:
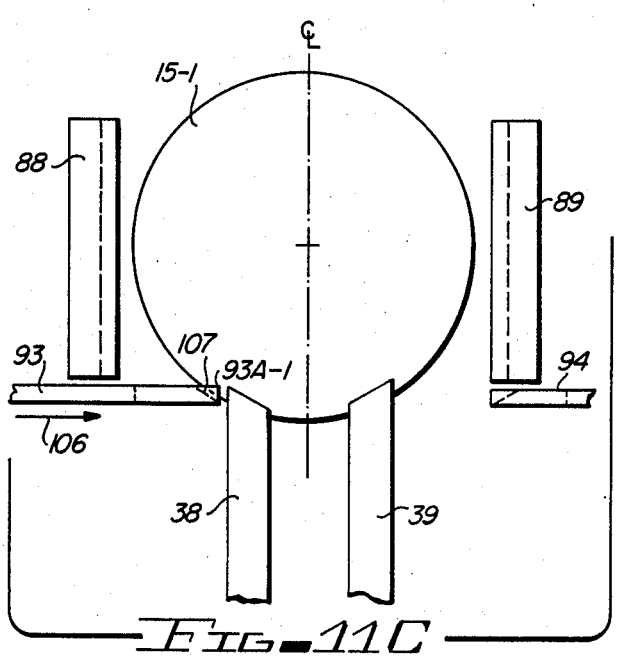

Referring now to FIG. 11C, elevator members 38 and 39 reach a maximum height, and first retainer 93 moves into wafer holding region 46 in the direction indicated by arrow 106. Elevators 38 and 39 begin to lower, so that two edge points 107 of each of the wafers 15 engage corresponding V-shaped front retainer grooves such as 93A-1.

Referring now to FIG. 11D, as elevators 38 and 39 continue to move downward in the direction of arrows 109, the wafers 15 roll in the direction of arrow 110 so that their right hand edges (as shown in FIG. 11D) roll into and rest in the appropriate V-shaped grooves 89A-1, 89A-2, etc. of retainer block 89, thereby supporting all of the wafers 15 in the first plastic carrier 1 in wafer holding region 46.

Next, after elevators 38 and 39 have been lowered to their lowest position the first wafer carrier 1 is removed from stand 34. In the preferred embodiment of the invention, a photosensor 112 (FIG. 7) detects the removal of one of the legs of plastic carrier 1 and causes the entire head mechanism 82, including front and rear retainer blocks 88 and 89 and front and rear retainers 93 and 94 to shift laterally 3/32 of an inch. Of course, this shifts the 25 wafers that are presently being held in wafer holding region 46 3/32 of an inch.

Figure 12A:
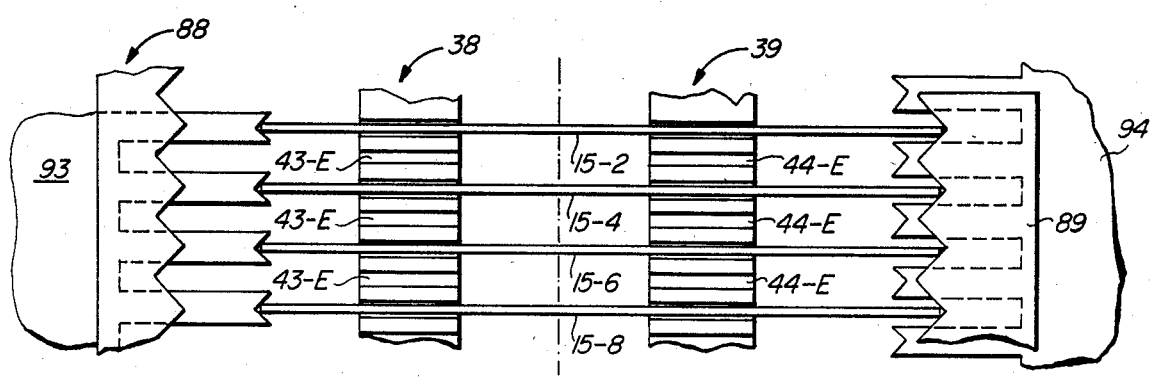
FIGS. 12A and 12B are top view diagrams useful in illustrating the shifting of the wafer holding head mechanism of FIG. 5 during a wafer transfer operation.

By way of definition, it will be assumed that the "odd numbered" wafer supporting grooves 43 and 44 are initially (before the above mentioned shift) aligned with the V-shaped grooves of first retainer 93 and second retainer block 89 and the "even numbered" wafer supporting grooves 43 and 44 are initially aligned with the V-shaped grooves of second retainer 94 and first retainer block 88. This results in the "even numbered" wafers, such as 15-2, 15-4, etc. from the first plastic carrier being supported by the V-shaped grooves of first retainer 93 and the V-shaped grooves of second retainer block 89, as shown in FIG. 12A.

Figure 12B:
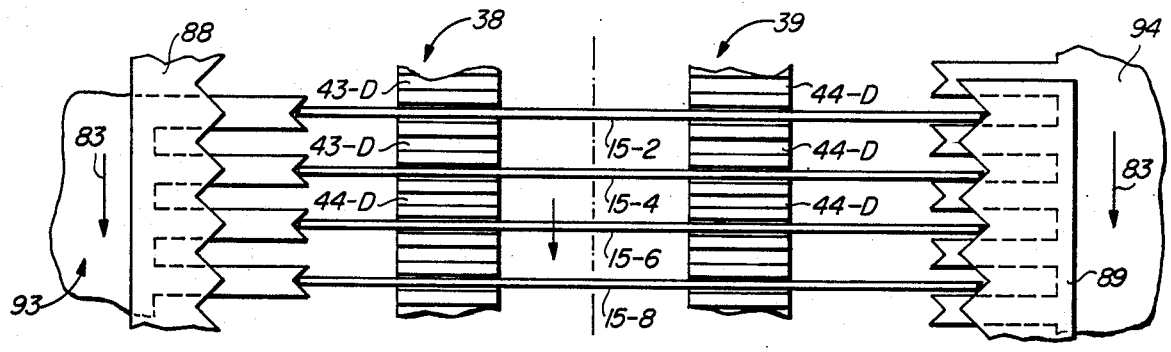

Then, the result of the above-mentioned shift of head mechanism 82, in the directions of arrows 83 (FIGS. 5 and 12B), is alignment of the "even numbered" wafer supporting slots 43 and 44 with the V-shaped grooves of second retainer 94 and first retainer block 88. In FIGS. 12A and 12B, reference numerals 43-E and 44-E designate even numbered wafer supporting slots in elevator members 38 and 39, respectively, and reference numerals 43-D and 44-D represent odd numbered wafer supporting slots.

Thus, it can be seen that when the second plastic carrier and the second group of 25 wafers are used to repeat the previously described cycle of operation, the odd numbered wafer supporting slots 43-D and 44-D will now be positioned between the first group of wafers in holding region 46, as shown in FIG. 6.

Returning now to FIG. 11E, after the second plastic carrier has been positioned on stand 34 elevators 38 and 39 rise slowly in the direction of arrows 114. Second retainer 94 remains receded, but first retainer 93 remains extended into wafer holding region 46 in order to continue supporting the first group of wafers 15. Reference numeral 15A designates the second group of 25 wafers now being lifted by elevator members 38 and 39 from the second plastic carrier. The 25 wafers 15A pass through the respective slots such as 93A-1 in first retainer 93, between the wafers 15 and into wafer holding region 46.

Figure 11F:
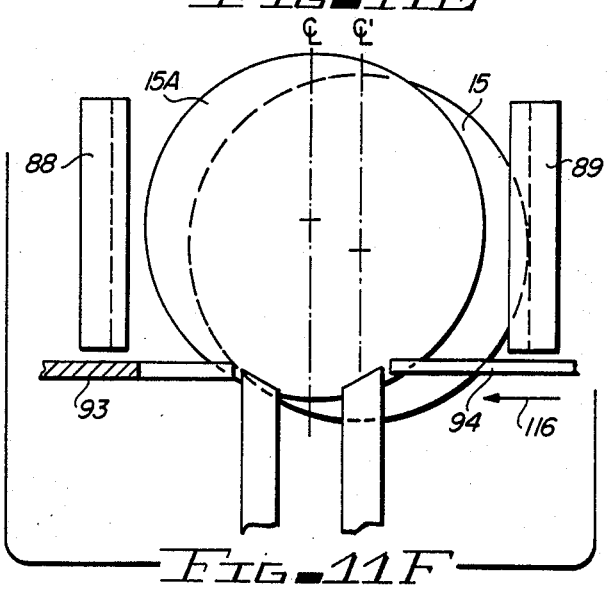
Figure 11G:
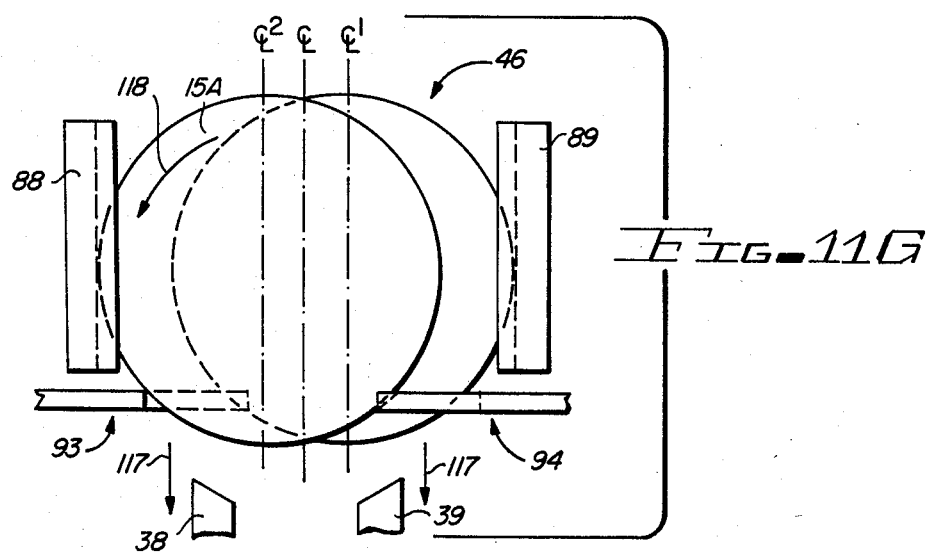

Referring now to FIG. 11F, after elevators 38 and 39 have reached their peak position, second retainer 94 moves in the direction of arrow 116 into wafer holding region 46. Referring now to FIG. 11G, elevators 38 and 39 move downward in the direction indicated by arrows 117, causing the 25 wafers 15A to roll in the direction of arrow 118, since the right-hand portion of the wafers rest in the respective V-shaped grooves such as 94-1, 94-2, etc. of retainer 94. The left edges of wafers 15A then come to rest in the respectively aligned V-shaped grooves 88A-1, 88A-2, etc. of front retainer block 88, leaving all fifty wafers suspended in wafer holding region 46.

The next step in the process is to lower elevators 38 and 39 to their lowest position and remove the second plastic carrier.

Next, quartz boat 3 is positioned on stand 34. A second optical detector (not shown) detects the presence of an end of one of the rails 21 or 22, producing a signal that causes head 82 to shift back to its original position, so that the V-shaped grooves of first retainer 93 and second retainer block 89 are aligned with the above-mentioned odd numbered wafer supporting slots. The elevators 38 and 39 rise so that all 50 of the wafer holding slots 43 and 44 engage and slightly raise the 50 wafers 15 and 15A presently suspended in wafer holding region 46. It is believed that this portion of the operation will be quite clear without use of further drawings, which therefore have been omitted. Then, the first and second retainers 93 and 94 are retracted out of wafer holding region 46, and the elevators 38 and 39 and the 50 wafers are slowly lowered. Since all 50 wafer holding slots 43 and 44 are aligned with the 50 respective sets of grooves in the four horizontal rails of quartz boat 3, the 50 wafers are properly deposited into quartz boat 3, and the desired wafer transfer process has been completed.

In the presently preferred embodiment of the invention, electronic control circuitry that is easily implemented by those skilled in the art or manual controls are actuated to accomplish the above-described lowering of elevators 38 and 39, the lateral shifting of head mechanism 82 and extension and retraction of the first and second retainers 93 and 94 and wafer holding region 46. The entire operation requires approximately two minutes. No frictional contact of any of the wafer surfaces with the guide grooves of the plastic carriers 1 or the V-shaped grooves in the retainers 93 and 94 or the retainer blocks 88 and 89 has occurred during lowering of elevators 38 and 39, thereby minimizing production of silicon dust particles. Any silicon dust particles that are produced as the wafer edges contact the V-shaped grooves immediately fall below the level of the wafers and are unlikely to adhere to the wafer surfaces or the surfaces of the wafer holding slots 43 and 44 or any of the V-shaped grooves, all of which are conductive metal, such as aluminum, and are coated with Teflon to avoid electrostatic charge build-up that might otherwise affect such silicon dust particles.

The wafer transfer procedure that is complementary to that described above, namely the transfer of 50 wafers from quartz boat 3 into two plastic carriers, is entirely analogous to that described above. Therefore drawings illustrating this process have been omitted to avoid redundancy of illustration. However, for completeness, the basic steps of this transfer operation will be described. To begin the process, the quartz boat with 50 wafers therein is placed on stand 34. Optical sensing of the presence of the quartz boat on stand 3 affects any necessary shifting of head mechanism 82 to be sure that the odd numbered wafer supporting slots 43 and 44 are aligned with the V-shaped grooves of second retainer 94 and first retainer block 88. The elevators 38 and 39 rise, lifting the 50 wafers out of quartz boat 3 and into wafer holding region 46. The first and second retainers 93 and 94 then both are extended into wafer holding region 46. As the elevators 38 and 39 are lowered, the two groups each of 25 alternately positioned wafers roll into the configuration shown in FIG. 6 and FIG. 11G. Elevators 38 and 39 then are lowered to their minimim height, and the quartz boat 3 is replaced with the first plastic carrier. The elevators 38 and 39 rise through the interior of the first plastic carrier, lifting the 50 wafers a bit. The second retainer 94 is retracted from wafer holding region 46. Elevators 38 and 39 are lowered, and the 25 "odd numbered" wafers supported by the odd numbered wafer supporting slots 43 and 44 thereby pass through the deep slots (such as 93A-1, 93A-2, etc.) between the V-shaped grooves of first retainer 94 and are lowered into the first plastic carrier. Upon removal of the first plastic carrier, the head mechanism 82 laterally shifts 3/32 of an inch to align the V-shaped grooves of the first retainer 93 and second retainer block 89 and the remaining 25 wafers therein. The second plastic carrier is placed on stand 34. Elevators 38 and 39 are raised. The first retainer 93 is retracted, and the second group of wafers is lowered into the second plastic holder. Thus, the second desired transfer has been completed.

The above-described embodiment of the invention provides the basis for a small, table top wafer transfer system that is much smaller than previous systems manufactured by the present assignee or any other known wafer transfer. For five inch wafers, the device of the present invention has a height of 24 inches, a length of 15 inches and a width of 15 inches. For six inch wafers, the device will be slightly greater in height.

While a particular embodiment of the invention has been described in detail, those skilled in the art will be able to make various modifications to the described embodiment of the invention and the method of operation thereof without departing from the true spirit and scope of the invention. It is intended that wafer transport systems and methods which are equivalent to the one described and claimed in the sense that their features and/or steps of operation perform substantially the same function in substantially the same way to obtain substantially the same result are within the scope of the invention. For example, other transfer operations such as transferring wafers from a 25-wafer plastic carrier to a 25-wafer quartz carrier can be readily accomplished by omitting the shifting of the head mechanism by 3/32 of an inch, or wafers simultaneously could be transferred from one 50-wafer carrier to another. Furthermore, there are other ways of achieving the results of the described lateral shifting of the head 91 by three/thirty-secondths of an inch prior to lifting the wafers from a second plastic carrier into the wafer holding region. For example, the position of the stand 34 or the elevator members 38 and 39 could be laterally shifted three/thirty-secondths of an inch instead.

I claim:

1. A wafer transfer system for transferring semiconductor wafers between first and second wafer carriers, said system comprising in combination:
   (a) carrier support means for receiving and supporting either of said first and second wafer carriers;
   (b) elevator means for engaging lower edge portions of wafers in the one of said first and second wafer carriers then on said carrier support means and raising the wafers into a wafer holding region located above said one of said wafer carriers, and for engaging lower edge portions of wafers in said wafer holding region and lowering them into respective sets of grooves in the one of said first and second wafer carriers then on said carrier support means;
   (c) first and second spaced groups of wafer supporting grooves in said elevator means, each wafer supporting groove of said first group being aligned with a corresponding wafer supporting groove of said second group to cooperate therewith in engaging lower edge portions of a wafer to support that wafer, wherein a first wafer supporting groove of said first group includes a first flat, vertical surface for engaging a first peripheral portion of a first face of a first wafer and a first steeply inclined surface opposed to said first flat vertical surface for supporting an edge point of said first wafer and exerting a horizontal force, due to the weight of said first wafer, that urges said first peripheral portion of said first wafer tightly against said first flat, vertical surface, and wherein a first wafer supporting groove of said second group includes a second flat, vertical surface for engaging a second peripheral portion of an opposite second face of said first wafer and a second steeply inclined surface opposed to said second flat, vertical surface for supporting another edge point of said first wafer and exerting a horizontal force, due to the weight of said first wafer, that urges said second peripheral portion of said first wafer tightly against said second flat, vertical surface, whereby said first wafer is held firmly in a precisely vertical position by said first wafer supporting grooves of said first and second groups, respectively, during upward and downward movement of said elevator means;

(d) first retaining means, movable into said wafer holding region while a first group of wafers is being held therein and having a plurality of grooves, for retaining said wafers of said first group in said wafer holding region after said elevator means is lowered, and retractable from said wafer holding region to allow said wafers of said first group to be lowered from said wafer holding region by said elevator means, wherein said plurality of grooves of said first retaining means engage lower edges of respective wafers of said first group spaced from and adjacent to said edge portion engaged by said wafer supporting grooves; and (e) second retaining means, disposed on an opposite side of said wafer holding region from said first retaining means, and having a plurality of grooves that are aligned with said plurality of grooves of said first retaining means, respective, edges of said wafers of said first group coming to rest in respective ones of said plurality of grooves of said second retaining means as said elevator means is lowered.

2. The wafer transport system of claim 1 wherein said elevator means engages only the lower edge portions of said wafers, and wherein said first retaining means includes a plurality of slots located between successive ones of said grooves of said first retaining means to allow a second group of wafers to be raised by said elevator means into said wafer holding region while said first group of wafers is retained therein by said first retaining means.

3. The wafer transport system of claim 2 further including third retaining means, movable into said wafer holding region from a side thereof opposite to said first retaining means while said second group of wafers is being held therein and having a plurality of grooves and a plurality of slots located between successive ones of those grooves, for retaining said wafers of said second group in said wafer holding region after said elevator means is lowered, said third retaining means being retractable from said wafer holding region to allow said wafers of said second group to be lowered from said wafer holding region by said elevator means, said slots of said third retaining means allowing said first plurality of wafers to be raised into or lowered out of said wafer holding region while said second group of wafers is being retained in said wafer holding region by said second retaining means.

4. The wafer transfer system of claim 3 including fourth retaining means, disposed on an opposite side of said wafer holding region from said third retaining means and having a plurality of grooves that are respectively aligned with said plurality of grooves of said third retaining means, said wafers of said second group rolling about the respective grooves of said third retaining means until their side edges come to rest respective corresponding grooves of said fourth retaining means.

5. The wafer transfer system of claim 4 wherein the center-to-center spacing between said wafer supporting grooves of said first and second groups of grooves in said elevator means half the center-to-center spacing of said grooves of said first, second, third and fourth retaining means, and wherein said grooves of said first and second retaining means initially are respectively aligned with successive odd-numbered ones of said wafer supporting grooves of said first and second groups, and wherein said grooves of said third and fourth retaining means initially are aligned with successive even-numbered ones said wafer supporting grooves of said first and second groups.

6. The wafer transfer system of claim 5 including shifting means for shifting said first, second, third, and fourth retaining means to selectively align said odd numbered wafer supporting grooves of said first and second groups with said grooves of said first and second retaining means or said grooves of said third and fourth retaining means, whereby said first group of wafers can be raised into said wafer holding region by means of one set of alternate ones of said wafer supporting grooves and retained therein by means of said first and second retaining means and, after said shifting of said second group of wafers, can be raised into said wafer holding region by means of said one set of wafer supporting grooves and retained there, with said first group of wafers, by means of said third and fourth retaining means.

7. The wafer transfer apparatus of claim 6 wherein said grooves of said first, second, third, and fourth retaining means are substantially V-shaped.

8. The wafer transfer apparatus of claim 6 wherein said first retaining means is located below said fourth retaining means and said third retaining means is located below said second retaining means.

9. The wafer transfer apparatus of claim 7 wherein said first carrier is a 25 wafer plastic carrier with a center-to-center wafer groove spacing of 3/16 of an inch and said second carrier is a 50 wafer quartz diffusion boat with a center-to-center wafer groove spacing of 3/32 of an inch.

10. A method of transferring semiconductor wafers from a first carrier to a second carrier, said method comprising the steps of:

(a) lifting a first group of semiconductor wafers out of said first carrier and into a wafer holding region by means of an elevator that is extendable upward through an open center region of said first carrier, and simultaneously supporting said wafers of said first group in precise spaced parallel relationship to each other by engaging a lower edge of a first face of each of said wafers with a respective steeply inclined surface so that the weight of each wafer causes a lower peripheral flat portion of an opposite second face of that wafer to be forced against a respective opposed rigid flat vertical groove wall to prevent each of said wafers from tilting away from the respective inclined surfaces and by also simultaneously engaging a lower edge of the second face of each of said wafers with a respective steeply inclined surface so that the weight of each wafer causes a lower peripheral flat portion of the first face of that wafer to be forced against a respective rigid flat vertical groove wall to prevent each of said wafers from tilting;

(b) inserting a first retainer into said wafer holding region to engage edges of the wafers of said first group to retain said wafers of said first group in said wafer holding region when said elevator is lowered;

(c) lowering said elevator from said wafer holding region and through said open center region of said first carrier;

(d) removing said first carrier from a position over a region into which said elevator is lowered;

(e) placing said second carrier over said region into which said elevator is lowered;

(f) raising said elevator up through an open center region of said second carrier into said wafer holding region to lift said wafers of said first group;

(g) withdrawing said first retainer from said wafer holding region; and (h) lowering said elevator from said wafer holding region and through said open center region of said carrier to deposit said first group of wafers in said second carrier.

11. The method of claim 10 including, after step (d), placing a third carrier with a second group of wafers therein over said elevator, lifting said second group of semiconductor wafers out of said third carrier into said wafer holding region by means of said elevator, and extending a second retainer into said wafer holding region to engage edges of the wafers of said second group to retain said wafers of said second group in said wafer holding region when said elevator is lowered.

12. The method of claim 11 wherein said first retainer has a plurality of deep slots which allow passage therethrough of wafers of said second group and said second retainer has a plurality of deep slots which allow passage therethrough of wafers of said first group.

13. The method of claim 10 including the step of shifting the position of said wafers of said first group in said wafer holding region by a distance equal to half of the center-to-center spacing of the wafers of said first group for lifting said second group of wafers into said wafer holding region so that wafers of said second group are alternately spaced with wafers of said first group in said wafer holding region.

14. The method of claim 10 wherein step (a) includes simultaneously lifting a second group of wafers out of said first carrier into said wafer holding region and wherein step (b) includes extending a second retainer into said wafer holding region to engage the edges of the wafers of said second group to retain said wafers of said second group in said wafer holding region when said elevator is lowered, wherein said wafers of said first group are positioned in said wafer holding region alternately with wafers of said second group, said method including, after step (h), removing said second carrier from the position over said region into which said elevator is lowered and placing a third carrier over said region into which said elevator is lowered, raising said elevator up through an open center region of said third carrier into said wafer holding region to engage said wafers of said second group, withdrawing said second retainer from said wafer holding region, and lowering said elevator from said wafer holding region and through said open center region of said third carrier to deposit said second group of wafers in said third carrier.

15. The method of claim 14 including shifting said group of wafers in said wafer holding region through a distance equal to the center to center spacing between wafers of said first and second groups when said wafers of said first and second group are all in said wafer holding region before raising said elevator to engage said wafers of said second group subsequently to step (h).

* * * * *